United States Patent [19]

Demura et al.

[11] Patent Number: 4,841,487

[45] Date of Patent: Jun. 20, 1989

[54] SEMICONDUCTOR MEMORY DEVICE WITH ADDRESS GENERATOR

[75] Inventors: Shigeki Demura; Toshio Oura, both of Tokyo, Japan

[73] Assignee: NEC Corporation, Tokyo, Japan

[21] Appl. No.: 160,983

[22] Filed: Feb. 26, 1988

[30] Foreign Application Priority Data

Feb. 27, 1987 [JP] Japan .................. 62-45742

[51] Int. Cl.$^4$ .............................................. G11C 13/00
[52] U.S. Cl. ........................... 365/230.01; 365/189.05
[58] Field of Search ............... 365/189, 191, 201, 207, 365/230

[56] References Cited

U.S. PATENT DOCUMENTS 4,739,497  4/1988  Itoh et al. ............................ 365/230

Primary Examiner—Terrell W. Fears
Attorney, Agent, or Firm—Sughrue, Mion, Zinn, Macpeak & Seas

[57] ABSTRACT

For improvement in operation speed, there is disclosed a semiconductor memory device comprising a memory cell array associated by a addressing circuit for reading out a plurality of data bits, a series of selector modules operative to decrease in number the data bits stage by stage, a temporary data storage module preserving the data bits fed from the final stage of the selector module and supplying all of the data bits to a destination, and a control circuit operative to produce an internal addressing signal for selection of the data bits, wherein the addressing circuit and the selector module except for the final stage of the selector module are supplied with the internal addressing signal for selection but the final stage of the selector module is directly supplied from the temporary data storage with a part of data bits, thereby realizing a parallel operation for reduction in time period for read-out operation.

15 Claims, 5 Drawing Sheets

PRIOR-ART

PRIOR-ART

SEMICONDUCTOR MEMORY DEVICE WITH ADDRESS GENERATOR

FIELD OF THE INVENTION

This invention relates to a semiconductor memory device and, more particularly, to an address generator incorporated in a read only memory device.

BACKGROUND OF THE INVENTION

A typical example of the read only memory device is illustrated in FIG. 1 of the drawings and comprises a memory cell array 1 having a plurality of memory cells arranged in rows and columns, and the memory cells in the respective rows are accompanied by bit lines 2, respectively. Each of the memory cells provides or does not provide a conduction path between one of the bit lines 2 and the ground depending upon a data bit preserved therein when the memory cell is accessed. The bit lines 2 are grouped by four, and these four bit lines have gate transistors 3, 4, 5 and 6, respectively. In order to specify the memory cells each selected from each of the rows, the read only memory device further comprises a first decoder circuit 7, and a second decoder circuit 8. The first decoder circuit 7 and second decoder circuit 8 are supplied from a control circuit, or an internal address generator 9 with eight bits of an internal address signal and two bits of the internal address signal, respectively, and the internal address signal is produced on the basis of the data bits read out from the memory cells during the previous read-out operation. The first decoder circuit 7 has a plurality of control lines each coupled to the gate electrodes of the memory cells in each column, and the second decoder circuit 8 has four control lines each coupled to every fourth gate transistor. Namely, the first control line of the second decoder circuit 8 is coupled to the gate transistors each provided in the first bit line of each bit line group, and the second control line of the second decoder circuit 8 is coupled to the gate transistors each provided in the second bit line of each bit line group. Similarly, the third control line of the second decoder circuit 8 is coupled to the gate transistors each provided in the third bit line of each bit line group, and the fourth control line of the second decoder circuit 8 is coupled to the gate transistors each provided in the fourth bit line of each bit line group. All of the bit line groups are coupled to input nodes of a plurality of buffer circuits 10, 11 and 12, respectively, and output nodes of the buffer circuits 10, 11 and 12 are coupled to input nodes of a plurality of flip-flop circuits 13, 14 and 15, respectively. The flip-flop circuits 13, 14 and 15 are triggered by a clock pulse CL and respectively latch the data bits appearing at the respective output node of the buffer circuits 10, 11 and 12. Output nodes of the flip-flop circuits 13, 14 and 15 are coupled in parallel to data input nodes of the control circuit 9 as well as a destination. All of the bit lines 2 are supplied with a positive voltage level through precharging transistors one of which is shown and designated by reference numeral 16.

The read-out operation will be hereinunder described in detail with reference to FIG. 2 of the drawings. Assuming now that data bits accessed in the previous read-out operation are latched by the flip-flop circuits 13, 14 and 15 in synchronous with a clock pulse CL at time t1, the data bits are supplied from the flip-flop circuits 13, 14 and 15 to the control circuit 9 and the destination at time t2, then the control circuit 9 latches the data bits fed from the flip-flop circuits 13, 14 and 15. The control circuits 9 carries out an operation to produce a new internal address signal, and the eight bits of the new internal address signal are supplied from the control circuit 9 to the first decoder circuit 7 at time t3. With the eight bits of the new internal address signal, the first decoder circuit 7 allows one of the control lines thereof to go up to an active high level at time t4, so that memory cells in one of the columns turn on or remain in the off states depending upon the data bits preserved therein. As described hereinbefore, all of the bit lines 2 are supplied with the positive voltage level, and, for this reason, the bit lines have either high or ground voltage level depending upon the state of the memory cells. Thus, each data bit of either high or ground voltage level appears on each of the bit lines 2. The two bits of the internal address signal have been supplied from the control circuit 9 to the second decoder circuit 8, so that the second decoder circuit 8 allows one of the control lines thereof, for example the first control line, to go up to an active high level at time t4. When the first control line goes up to the active high level, the gate transistors including the gate transistor 3 turn on to transfer the data bits to the buffer circuits 10, 11 and 12, thereby causing the buffer circuits 10, 11 and 12 to latch the data bits at time t5. When the clock pulse CL appears at the flip-flop circuits 13, 14 and 15, the data bits are latched by the flip-flop circuits 13, 14 and 15, respectively, at time t6, and the data bits are transferred from the flip-flop circuits 13, 14 and 15 to the control circuit 9 and the destination as similar to the data bits read out during the previous read-out operation at time t7. With the data bits, the control circuit 9 produces a new internal address which is fed to the first and second decoder circuits 7 and 8, and, thus, the read only memory repeats the read-out operations.

However, a problem is encountered in the prior-art read only memory device in that a long time period is required for every single read-out operation. Namely, a first time period T1 measuring from t1 to t3 is needed for propagation of the data bits from the latching operation of the flip-flop circuits 13, 14 and 15 to production of the new internal address signal, and a second time period T2 measuring from time t3 to time t6 is consumed for the decoding of the new internal address signal, the read-out of the new data bits and transferring the new data bits to the flip-flop circuits 13, 14 and 15. Thus, the first time period T1 is followed by the second time period T2, so that every single read-out operation needs a long time period T3 which is approximately equal to the sum of the first and second time periods T1 and T2. This results in a low operation speed for a read-out operation.

SUMMARY OF THE INVENTION

It is therefore an important object of the present invention to provide a semiconductor memory device which operates at an improved speed.

To accomplish these objects, the present invention proposes to cause the two time period to partially overlap each other.

In accordance with one aspect of the present invention, there is provided a semiconductor memory device comprising (a) a memory cell array having a plurality of memory cells arranged in rows and columns, each of the memory cells storing a data bit, (b) an addressing circuit operative to cause a plurality of data bits to be read out from the memory cell array, (c) a plurality of selector modules coupled in series and having a first stage of selector module and a final stage of selector module, each of the selector modules being operative to decrease in number the data bits passing therethrough, the first stage of selector module coupled to the memory cell array, (d) a plurality of decoder circuits each operative to produce an activation signal fed to each of the selector modules for specifying the data bits passing therethrough, (e) a temporary data storage module coupled to the final stage of selector module and operative to latch the data bits supplied from the final stage of selector module, the data bits latched by the temporary data storage module being supplied to a destination, the temporary data storage module directly supplying a part of the data bits latched therein to the addressing circuit and the selector modules except for at least the final stage of selector module, and (f) a control circuit operative to produce an internal address signal on the basis of remaining data bits latched by the temporary data storage as a result of a predetermined operation, the internal address signal being supplied to at least the final stage of selector module.

In accordance with another aspect of the present invention, there is disclosed a semiconductor memory device comprising (a) a memory cell array having a plurality of memory cells arranged in rows and columns, each of the memory cells storing a data bit; (b) an addressing circuit operative to cause a plurality of data bits to be read out from the memory cell array, (c) a plurality of selector modules coupled in series and having a first stage of selector module and a final stage of selector module, each of the selector modules being operative to decrease in number the data bits passing therethrough, the first stage of selector module coupled to the memory cell array (d) a plurality of decoder circuits each operative to produce an activation signal fed to each of the selector modules for specifying the data bits passing therethrough, (e) a temporary data storage module coupled to the final stage of selector module and operative to latch the data bits supplied from the final stage of selector module, the data bits latched by the temporary data storage module being supplied to a destination; and, (f) a control circuit operative to produce a plurality of internal address signals including a final internal address signal on the basis of the data bits latched by the temporary data storage and supply the internal address signals to the addressing circuit and the selector module in succession, the final internal address signal being finally supplied to the final stage of selector module.

Each of the memory cells may be formed by a read only memory cell. In one implementation, each read only memory cell may have a metal-insulator-semiconductor structure, and the insulator is formed to be thin or thick depending upon a logic level of the data bit preserved therein. The addressing circuit may specify a plurality of memory cells for reading out the data bits, and each memory cell may be selected from each of the rows.

The rows may be grouped by a predetermined number, typically four, to form a plurality of memory cell groups, and the first stage of selector module is operative to pass every single data bit from each of the memory cell groups. In one implementation, each of the selector modules may comprise a plurality of n-channel type gate transistors arranged in parallel, and the first stage of selector module further comprises buffer circuits each coupled in series to each of the gate transistors. Each of the buffer circuits may be of the inverting type, and, in this implementation, the semiconductor memory device further comprises a plurality of inverting buffer circuits coupled in parallel between the final stage of selector module and the temporary data storage module.

The temporary data storage module may comprise a plurality of clocked flip-flop circuits coupled in parallel between the final stage of selector module and the destination. If the semiconductor memory device serves as a microprogram control unit, the control circuit serves as a microprogram sequencer.

BRIEF DESCRIPTION OF THE DRAWINGS

The features and advantages of a read only memory device according to the present invention will be more clearly understood from the following description taken in conjunction with the accompanying drawings in which.

DESCRIPTION OF THE PREFERRED EMBODIMENT

First Embodiment

Figure 3:
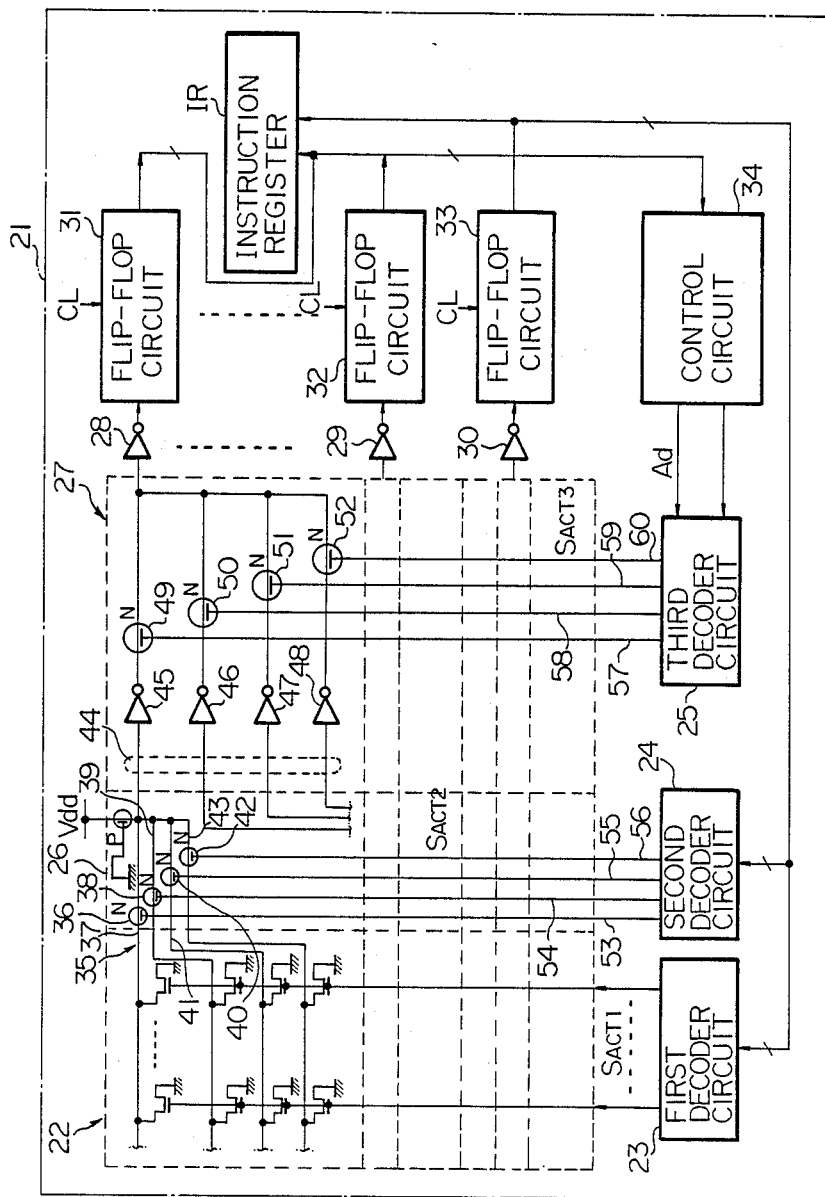
FIG. 3 is a circuit diagram showing the circuit arrangement of a read only memory device embodying the present invention.

Referring first to FIG. 3 of the drawings, there is shown the circuit arrangement of a read only memory device embodying the present invention. The read only memory device shown in FIG. 3 is fabricated on a single semiconductor chip 21, typically a silicon chip, together with many electronic circuits. The read only memory device is applied to a storage of micro-instructions of a single-chip microcomputer, and, for this reason, an arithmetic and logic unit, control circuit for internal control signals, registers, input/output buffer circuit and so on necessary to execute a micro-instruction are formed on the same semiconductor chip. The read only memory device illustrated in FIG. 3 largely comprises a memory cell array 22, first, second and third decoder circuits 23, 24 and 25, first and second selector modules 26 and 27 each provided with a plurality of selector circuits, a plurality of inverting buffer circuits three of which are designated by reference numerals 28, 29 and 30, a plurality of flip-flop circuits including flip-flop circuits 31, 32 and 33, and a control circuit 34.

The memory cells in each row are coupled to each of bit lines, and the bit lines are grouped by four to form bit line groups only one of which is shown and designated by reference numeral 35. In this instance, each of the memory cells has a MOS (metal-oxide-semiconductor) structure, however the oxide of each MOS structure is formed to be thick or thin depending upon a data bit fixedly stored therein. Namely, if a memory cell stores the data bit of logic "0" level, the oxide is formed to be relatively thin, then the memory cell provides a conduction path between one of the bit line and the ground upon activation. On the other hand, if a memory cell stores the data bit of logic "1" level, the oxide is formed to be relatively thick, then no conduction path takes place between one of the bit lines and the ground upon activation. The first decoder circuit 23 has a plurality of control lines equal in number to the columns of the memory cell array 22, and each of the control lines of the first decoder circuit 23 is coupled to the gate electrodes of the memory cells, or the metal layers of the MOS structures, in each column. Then, all of the memory cells in each column are simultaneously activated in the presence of a first activation signal $S_{ACT1}$ on the control line of the first decoder circuit. The first decoder circuit 23 produces the first activation signal $S_{ACT1}$ on the basis of a first internal address signal consisting of a plurality of bits.

One of the selector circuits of the first selector modules 26 comprises a plurality of transfer gates which are grouped by four, and each group is associated with each of the bit line groups. For the sake of simplicity, description will be made for the bit line group 35, because arrangement concerning another bit line group is similar to the bit line group 35. In the bit line group 35, a first transfer gate 36 intervenes in the first bit line 37 to propagate or block the data bit, and a second transfer gate 38 intervenes in the second bit line 39 for the sake of a switching operation. Similarly, a third transfer gate 40 is provided in the third bit line 41, and a fourth transfer gate 42 in the fourth bit line 43 provides or cuts off a conduction path for propagation of the data bit.

The bit line groups are coupled to signal lines which are grouped by four to form signal line groups, and one of the signal line groups is designated by reference numeral 44. The signal line groups are associated with the selector circuits of the second selector module 27, respectively, and one of the selector circuits is illustrated in detail in FIG. 3. Each of the selector circuits has four inverting buffer circuits 45, 46, 47 and 48 and four n-channel type transfer gates 49, 50, 51 and 52, and the inverting buffer circuits 45, 46, 47 and 48 are coupled in series to the transfer gates 49, 50, 51 and 52, respectively. Each of the series combinations of the inverting buffer circuits 45 to 48 and the transfer gates 49 to 52 respectively intervene the signal lines of the signal line group 44, so that the data bits on the signal lines of the signal line group 44 are transferred or blocked by the transfer gates 49 to 51, respectively.

The first and second selector modules 26 and 27 are accompanied by the second and third decoder circuits 24 and 25, respectively. Namely, the second decoder circuit 24 has four control lines 53, 54, 55 and 56, and the transfer gates of the first selector module 26 are gated by the four control lines 53 to 56. Namely, the control line 53 is coupled to the gate electrodes of the transfer gates respectively intervening in the first bit lines including the bit line 37, so that these transfer gates concurrently turn on in the presence of a second activation signal $S_{ACT2}$ of a positive high voltage level appearing on the control line 53. Similarly, the control line 54 is coupled to the gate electrodes of the transfer gates respectively intervening in the second bit lines including the second bit line 39 to allow these transfer gates to concurrently turn on when the second activation signal $S_{ACT2}$ appears on the control line 54, and all of the transfer gates intervening the third bit lines have respective gate electrodes coupled to the control line 55 for concurrent gating operation. The fourth control line 56 are provided for gating operation of the transfer gates intervening the fourth bit lines including the fourth bit line 43, then all of these transfer gates concurrently turn on in the presence of the second activation signal $S_{ACT2}$ on the fourth control line 56. The second decoder circuit 24 produces the second activation signal $S_{ACT}$ on the basis of a second internal address signal consisting of a plurality of bits.

As to the third decoder circuit 25, four control lines 57, 58, 59 and 60 are arranged in similar to the control lines 53, 54, 55 and 56. Namely, the control line 57 is coupled to the gate electrode of each transfer gate provided in the first signal line of each signal line group, and the control line 58 is coupled to the gate electrode of each transfer gate provided in the second signal line of each signal line group. Similarly, the control line 59 is coupled to the gate electrode of each transfer gate provided in the third signal line of each signal line group, and the control line 60 is coupled to the gate electrode of each transfer gate provided in the fourth signal line of each signal line group. The third decoder circuit thus arranged produces a third activation signal $S_{ACT3}$ of a positive high voltage level to supply to one of the control lines 57, 58, 59 and 60. The third activation signal $S_{ACT}$ is produced by the third decoder circuit 25 on the basis of a third internal address signal.

The signal line groups are coupled to input nodes of the respective inverting buffer circuits including the inverting buffer circuits 28, 29 and 30, and the inverting buffer circuits transfer the data bits respectively fed from the signal line groups to the flip-flop circuits including the flip-flop circuits 31, 32 and 33, respectively. In this instance, each of the flip-flop circuits is of the clocked type, so that each flip-flop circuit latches the data bit appearing at the output node of the inverting buffer circuit in response to a clock pulse CL. After latching operations of the flip-flop circuits, all of the data bits are transferred to a destination such as an instruction register IR, and the data bits are simultaneously transferred partially to the control circuit and partially to the first and second decoder circuits 23 and 24 as the first and second internal address signals. The control circuit 34 produces the third internal address signal Ad for specifying a microinstruction address on the basis of the part of the data bits fed from the flip-flop circuits, and the third internal address signal Ad is supplied to the third decoder circuit 25 for the gating operation. In this instance, the control circuit 34 is formed by a microprogram sequencer, however the control circuit 34 may be formed by a small size processor in another implementation.

Figure 4:
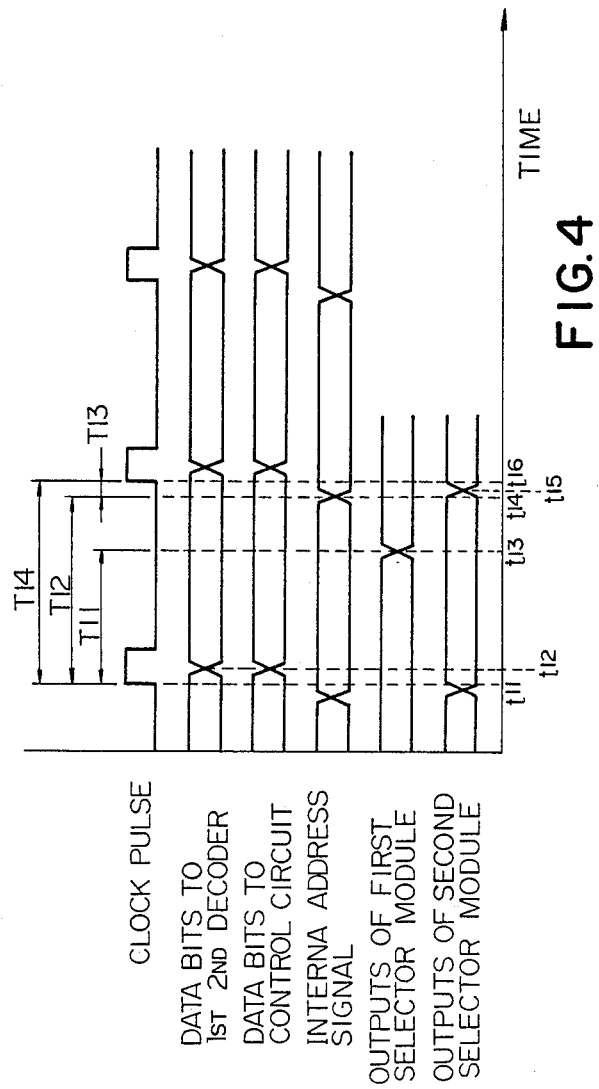
FIG. 4 is a diagram showing waveforms of essential signals which appears in the read only memory device illustrated in FIG. 3.

Operation will be hereinunder described with reference to FIG. 4 of the drawings. Assuming now that data bits accessed in the previous read-out operation are latched by the flip-flop circuits including the flip-flop circuits 31, 32 and 33 in synchronous with a clock pulse CL at time t11, all of the data bits latched by the flip-flop circuits are transferred to the destination or the instruction register IR. However, a part of the data bits are concurrently supplied from the flip-flop circuits including the flip-flop circuit 33 to the first and second decoder circuits 23 and 24 but the remaining data bits are supplied from the flip-flop circuits including the flip-flop circuits 31 and 32 to the control circuit 34 at time t12. Then, the first and second decoder circuits execute respective predetermined operations to produce the first and second activation signals $S_{ACT1}$ and $S_{ACT2}$, and, with the first activation signal $S_{ACT1}$, the memory cell array 22 supplies a plurality of new data bits to the first selector module 26 which in turn supplies a reduced number of the new data bits to the inverting buffer circuits 45 to 48 in response to the second activation signal $S_{ACT2}$ at time t13. Thus, the new data bits are preselected by the first and second decoder circuits 23 and 24 prior to the final determination of a new microinstruction address. For latter description, a time period measuring from the time t11 to time t13 is labeled as "T11" in the drawings.

The control circuit 34 was supplied from the flip-flop circuits with remaining data bits at time t12 and latched these data bits for determination of the new microinstruction address. Namely, the control circuits 34 carries out an operation to produce a new third internal address signal representing the new microinstruction address on the basis of the remaining data bits, and the new third internal address signal Ad is supplied from the control circuit 34 to the third decoder circuit 25 at time t14. With the new third internal address signal Ad, the third decoder circuit 25 causes one of the control lines 57 to 60 to propagate the third activation signal $S_{ACT3}$, so that the second selector module 27 allows the data bits preserved in the memory cells specified by the new third internal address signal Ad to pass therethrough at time t15. Then, the inverting buffer circuits including the buffer circuits 28 to 30 latches the new data bits, and, then, the new data bits are supplied to the flip-flop circuits upon application of the clocked pulse CL at time t16.

Figure 1:
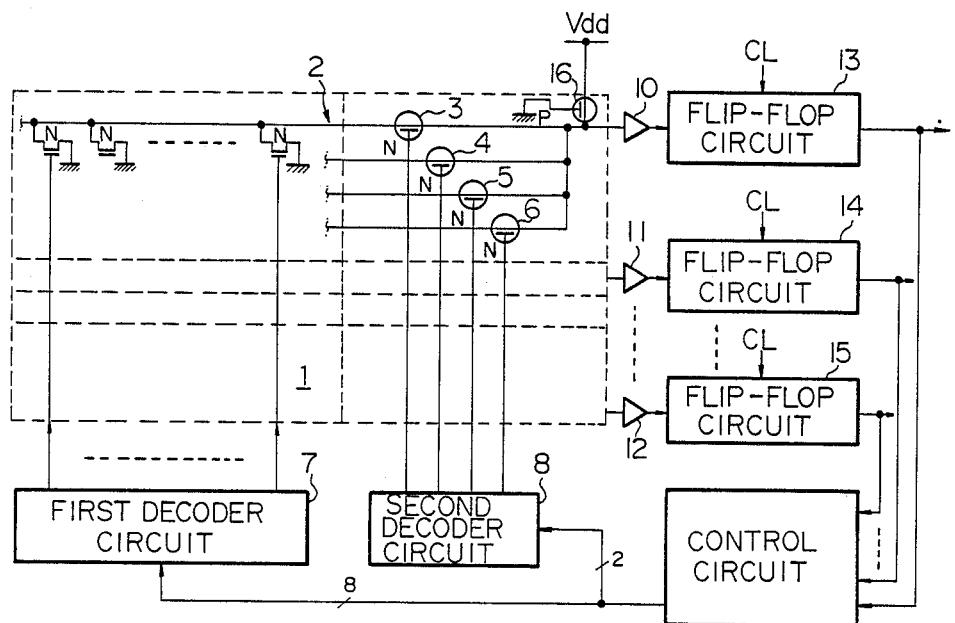
FIG. 1 is a circuit diagram showing the circuit arrangement of a prior-art read only memory device.
Figure 2:
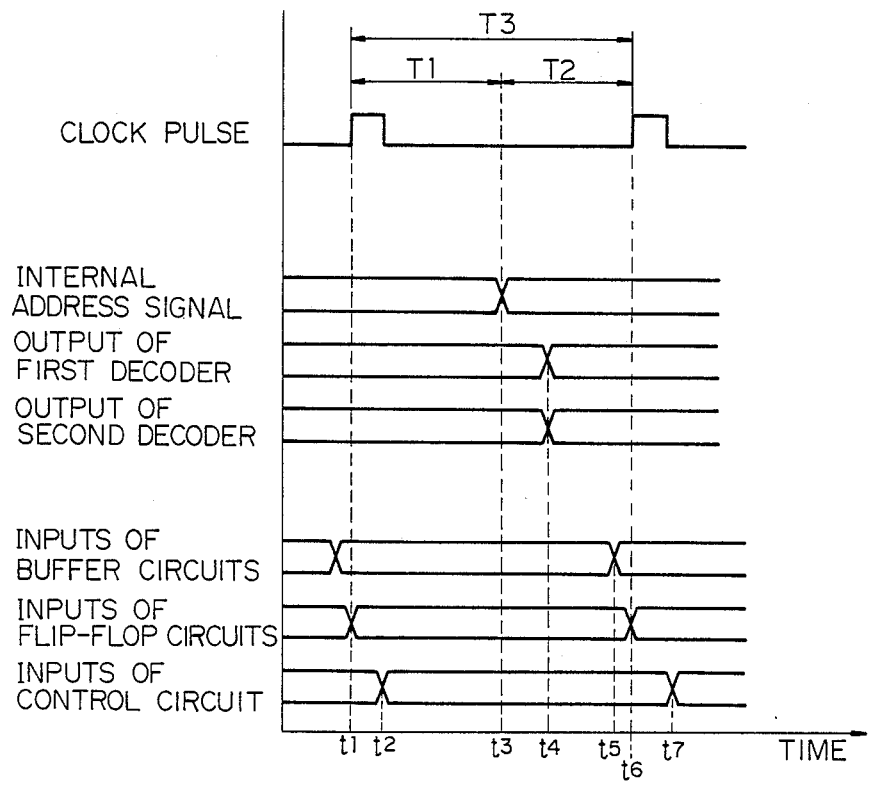
FIG. 2 is a diagram showing waveforms of essential signals which appears in the prior-art read only memory device.

A time period T12 measuring from time t11 to time t14 is consumed to produce the new internal address signal Ad representing the new microinstruction, and a time period T13 is necessary to produce the third activation signal $S_{ACT3}$ on the basis of the new third internal address signal Ad. As will be seen from FIG. 4, the time period T11 overlaps the time period T12, so that the read only memory device illustrated in FIG. 3 needs a time period T14 approximately equal to the sum of the time periods T11 and T13 or T12 and T13 for every single read-out operation. Comparing FIG. 4 with FIG. 2, it is understood that the time period T14 is shorter than the time period T3 because of the overlapping of the time periods T11 and T12. This results in that the read only memory device according to the present invention operates at an improved speed.

Second Embodiment

Figure 5:
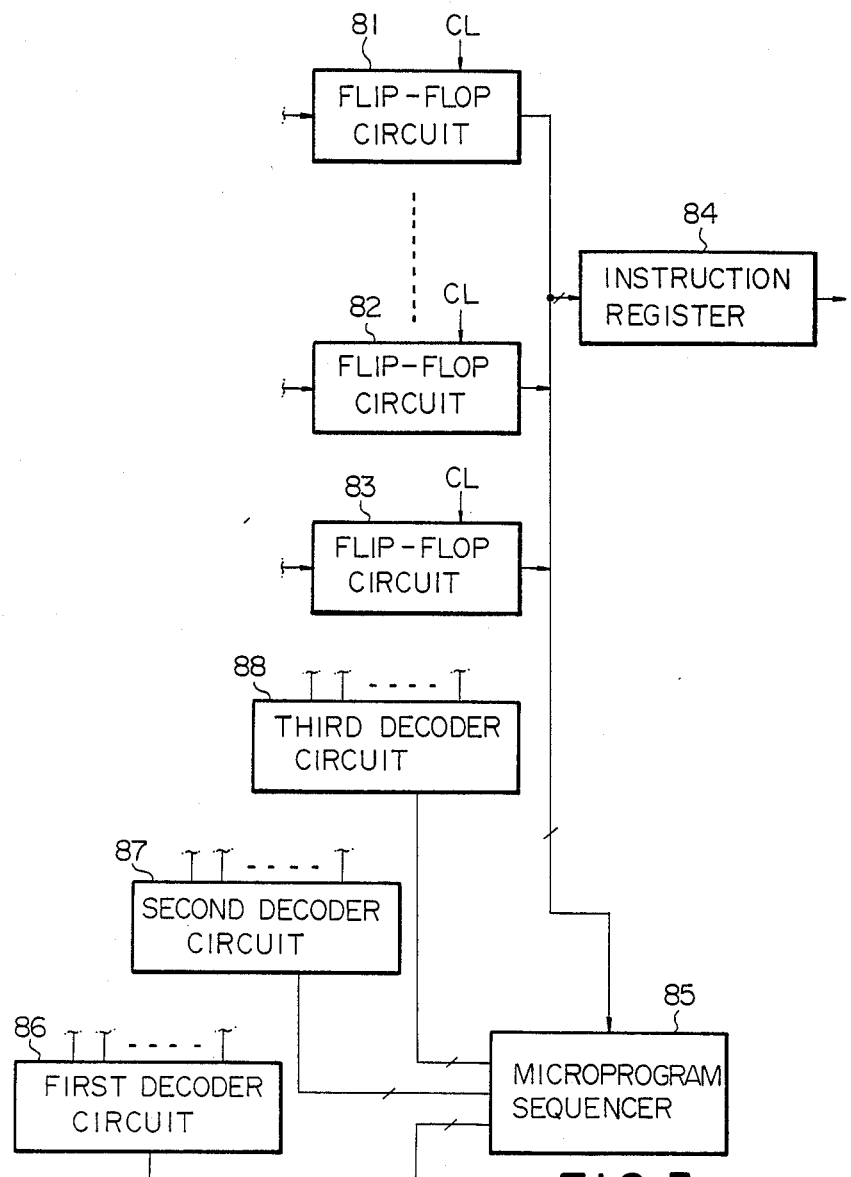
FIG. 5 is a diagram showing the arrangement of a flip-flop circuits, a control circuit and decoders incorporated in another read only memory device embodying the present invention.

Turning to FIG. 5 of the drawings, there is shown the arrangement of the flip-flop circuits 81, 82 and 83, an instruction register 84, a microprogram sequencer 85, and first, second and third decoder circuits 86, 87 and 88. Each of the flip-flop circuits preserves a data bit read out from a memory cell array (not shown) in response to a clock pulse CL, and the data bits preserved in the flip-flop circuits are supplied in parallel to the instruction register 84 and the microprogram sequencer 85. When the data bits are latched by the microprogram sequencer 85, the microprogram sequencer 85 directly passes a part of the data bits as a first internal address signal which is supplied to the first and second decoder circuits 86 and 87 for preselecting operation. Then, the data bits read out from the memory cell array are reduced in number by first and second selector modules.

The microprogram sequencer 85 concurrently executes an operation for producing a second internal address signal representing the new microinstruction address on the basis of the remaining data bits. When the second internal address signal is produced, the microprogram sequencer 85 supplies the second internal address signal to the third decoder circuit 88 for final determination of the microinstruction address.

In the embodiment hereinbefore described, the first and second decoder circuits 23 and 24 are directly supplied from the flip-flop circuits with the part of the data bits, however, in another embodiment, all of the data bits are supplied from the flip-flop circuits to the control circuit 34, and the control circuit 34 produces a plurality internal address signals sequentially supplied to the first and second decoder circuits and the third decoder circuit. Moreover, the buffer circuits 45 to 48 and 28 to 30 are of the inverting type, however it is possible to replace the inverting type buffer circuits to noninverting type buffer circuits. The present invention is applied to the instruction storage of the microcomputer, however the present invention is applicable to an instruction ROM (read-only memory) for a microprocessor, a general-purpose read only memory device and a general-purpose random access memory device.

Although particular embodiment of the present invention have been shown and described, it will be obvious to those skilled in the art that various changes and modifications may be made without departing from the spirit and scope of the present invention.

What is claimed is:

1. A semiconductor memory device comprising
   (a) a memory cell array having a plurality of memory cells arranged in rows and columns, each of said memory cells storing a data bit;
   (b) an addressing circuit operative to cause a plurality of data bits to be read out from said memory cell array;
   (c) a plurality of selector modules coupled in series and having a first stage of selector module and a final stage of selector module, each of said selector modules being operative to decrease in number said data bits passing therethrough, said first stage of selector module coupled to said memory cell array;
   (d) a plurality of decoder circuits each operative to produce an activation signal fed to each of said selector modules for specifying said data bits passing therethrough;
   (e) a temporary data storage module coupled to said final stage of selector module and operative to latch said data bits supplied from said final stage of selector module, said data bits latched by the temporary data storage module being supplied to a destination, said temporary data storage module supplying a part of said data bits latched therein to said addressing circuit and said selector modules except for at least said final stage of selector module; and
   (f) a control circuit operative to produce an internal address signal on the basis of remaining data bits latched by said temporary data storage as a result of a predetermined operation, said internal address signal being supplied to at least said final stage of selector module.

2. A semiconductor memory device as set forth in claim 1, in which each of said memory cells is formed by a read only memory cell.

3. A semiconductor memory device as set forth in claim 2, in which said read only memory cell has a metal-insulator-semiconductor structure, said insulator being formed to be thin or thick depending upon a logic level of said data bit preserved therein.

4. A semiconductor memory device as set forth in claim 1, in which said addressing circuit specifys a plurality of memory cells for reading out said data bits, each memory cell being selected from each of said rows.

5. A semiconductor memory device as set forth in claim 4, in which said rows are grouped by a predetermined number to form a plurality of memory cell groups and in which said first stage of selector module is operative to pass every single data bit from each of said memory cell groups.

6. A semiconductor memory device as set forth in claim 5, in which each of said selector modules comprising a plurality of gate transistors arranged in parallel.

7. A semiconductor memory device as set forth in claim 6, in which said first stage of selector module further comprises buffer circuits each coupled in series to each of said gate transistors.

8. A semiconductor memory device as set forth in claim 7, in which each of said buffer circuits is of the inverting type.

9. A semiconductor memory device as set forth in claim 8, in which said semiconductor memory device further comprises a plurality of inverting buffer circuits coupled in parallel between said final stage of selector module and said temporary data storage module.

10. A semiconductor memory device as set forth in claim 1, in which said temporary data storage module comprises a plurality of clocked flip-flop circuits coupled in parallel between said final stage of selector module and said destination.

11. A semiconductor memory device as set forth in claim 1, in which said semiconductor memory device serves as a microprogram control unit.

12. A semiconductor memory device as set forth in claim 11, in which said control circuit serves as a microprogram sequencer.

13. A semiconductor memory device comprising
(a) a memory cell array having a plurality of memory cells arranged in rows and columns, each of said memory cells storing a data bit;
(b) an addressing circuit operative to cause a plurality of data bits to be read out from said memory cell array;
(c) a plurality of selector modules coupled in series and having a first stage of selector module and a final stage of selector module, each of said selector modules being operative to decrease in number said data bits passing therethrough, said first stage of selector module coupled to said memory cell array;
(d) a plurality of decoder circuits each operative to produce an activation signal fed to each of said selector modules for specifying said data bits passing therethrough;
(e) a temporary data storage module coupled to said final stage of selector module and operative to latch said data bits supplied from said final stage of selector module, said data bits latched by the temporary data storage module being supplied to a destination; and
(f) a control circuit operative to produce a plurality of internal address signals including a final internal address signal on the basis of said data bits latched by said temporary data storage and to supply said internal address signals to said addressing circuit and said selector module in succession, said final internal address signal being finally supplied to said final stage of selector module.

14. A microprogram control unit incorporated in a microcomputer fabricated on a semiconductor chip, said microprogram control unit performing a read-out operation, comprising:
(a) a memory cell array having a plurality of memory cells arranged in rows and columns, each of said memory cells having a metal-insulator-semiconductor structure fixedly storing a data bit depending upon a thickness of the insulator, said rows being grouped by four to form a plurality of memory cell groups;
(b) a first decoder circuit operative to produce a first activation signal for reading out said data bits each selected from each of said rows;
(c) a second decoder circuit operative to produce a second activation signal of a positive high voltage level;
(d) a first selector module having a plurality of first selector circuits equal in number to said memory cell groups, each of said first selector circuits being provided with four transfer gates coupled in parallel to said four rows of each memory cell group, each first selector circuit being responsive to said second activation signal so as to allow said one of said data bits selected from each memory cell group to pass therethrough, said first selector circuits being grouped by four to form a plurality of first selector groups;
(e) a third decoder circuit operative to produce a third activation signal of a positive high voltage level;
(f) a second selector module having a plurality of second selector circuits equal in number to said first selector groups, each of said second selector circuits being provided with four series combinations each consisting of a buffer circuit and a transfer gate, each second selector circuit being responsive to said third activation signal to allow one of said data bits selected from said first selector groups to pass therethrough;
(g) a plurality of buffer circuits each coupled to each of said second selector circuits;
(h) a plurality of clocked flip-flop circuits each coupled to said each of said buffer circuits and responsive to a clocked pulse so as to latch said data bit fed from said buffer circuit coupled to each second selector circuit, all of said data bits latched by said clocked flip-flop circuits being transferred to an instruction register, a part of said data bits latched by said clocked flip-flop circuits being transferred to said first and second decoder circuits for producing said first and second activation signals; and
(i) a microprogram sequencer operative to execute a predetermined function for producing an internal address signal on the basis of remaining data bits, said internal address signal being supplied to said third decoder circuit for producing said third activation signal.

15. A semiconductor memory device comprising
(a) a memory cell array having a plurality of memory cells arranged in rows and columns, each of said memory cells storing a data bit;

(b) a plurality of bit lines each coupled to all of said memory cells in each row;

(c) a plurality of word lines each activating all of said memory cells in each column;

(d) a first decoder circuit responsive to a first internal address signal and operative to cause one of said word lines to activate said memory cells for reading out a plurality of data bits from said memory cell array, each of said data bits read out from said memory cell array appearing on each of said bit lines; p1 (e) a plurality of decoder/selector modules coupled in series and having a first stage of decoder/selector module supplied with said data bits from said memory cell array and a final stage of decoder/selector module, each of said selector modules being responsive to each of second to final internal address signal and operative to decrease in number said data bits passing therethrough; and (f) an internal address generating module operative to produce said first to final internal address signals on the basis of said data bits passing through said final stage of decoder/selector module, wherein said final internal address signal is produced at the latest of all.

* * * * *

UNITED STATES PATENT AND TRADEMARK OFFICE
CERTIFICATE OF CORRECTION

PATENT NO. : 4,841,487

DATED : June 20, 1989

INVENTOR(S) : Shigeki Demura and Toshio Oura

It is certified that error appears in the above-identified patent and that said Letters Patent is hereby corrected as shown below:

Claim 15, line 13, delete "p1" and begin a new paragraph with "(e)".

Signed and Sealed this

Eighth Day of May, 1990

Attest:

HARRY F. MANBECK, JR.

Attesting Officer

Commissioner of Patents and Trademarks